United States Patent
Suzuki et al.

(10) Patent No.: US 6,195,779 B1
(45) Date of Patent: Feb. 27, 2001

(54) MICROPROCESSOR HAVING BUILT-IN CRC SECTION AND METHOD FOR PERFORMING CRC OPERATIONS USING THE SAME

(75) Inventors: Kyouichi Suzuki, Toyohashi; Hideaki Ishihara, Okazaki; Akihiro Sasaki, Anjo; Nobutomo Takagi, Okazaki, all of (JP)

(73) Assignee: Denso Corporation, Kariya (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/499,009

(22) Filed: Jul. 6, 1995

(30) Foreign Application Priority Data

Jul. 7, 1994 (JP) .................................................. 6-156201

(51) Int. Cl.[7] .................................................. H03M 13/00
(52) U.S. Cl. .................................. 714/758; 714/757
(58) Field of Search ................... 371/37.1, 37.4, 371/37.5, 37.3, 37.2; 714/799, 748, 793, 758, 757; 342/42

(56) References Cited

U.S. PATENT DOCUMENTS

| | | | |
|---|---|---|---|
| 3,873,971 | * 3/1975 | En ........................................ | 714/793 |
| 4,119,945 | * 10/1978 | Lewis, Jr. et al. ..................... | 714/793 |
| 4,312,068 | * 1/1982 | Goss et al. ............................ | 371/37.6 |
| 4,404,674 | * 9/1983 | Rhodes ................................. | 714/793 |
| 4,742,520 | * 5/1988 | Hoac et al. ........................... | 371/49 |
| 4,750,176 | * 6/1988 | Van Veldhuizen ..................... | 714/748 |
| 4,914,661 | * 4/1990 | Mester ................................. | 371/40.1 |
| 4,939,741 | 7/1990 | Miyazaki .............................. | 714/781 |
| 5,111,461 | * 5/1992 | Miyazaki ............................. | 371/37.1 |
| 5,130,991 | * 7/1992 | Takano ................................. | 371/37.6 |
| 5,245,346 | * 9/1993 | Nishimura et al. .................... | 342/42 |
| 5,251,215 | * 10/1993 | Dravida et al. ................. | 371/37.7 X |
| 5,598,424 | * 1/1997 | Erickson et al. ..................... | 714/799 |

FOREIGN PATENT DOCUMENTS 0 230 730    12/1985    (EP) .

\* cited by examiner

*Primary Examiner*—Albert De Cady
*Assistant Examiner*—David Ton
(74) *Attorney, Agent, or Firm*—Pillsbury Madison & Sutro LLP

(57) ABSTRACT

To provide a microprocessor that can perform high-speed CRC code generation and can be implemented simply and at a low cost, a microprocessor has, at a part of a data input path to a shift circuit which is conventionally installed in an ALU of the microprocessor to execute shift commands, one bit of data that corresponds to the path, an exclusive OR circuit, which computes the exclusive OR of an uppermost bit of byte data and a bit data, is provided. For this circuit, a result according to a generating polynomial such as $[X^8+X^4+X^3+X^2+1]$ is determined on the basis of the installation location of the exclusive OR circuit along the path, and by setting an initial value to the byte data, inputting one bit of the transmission data sequentially to the bit data and operating the shift circuit, a computed result for the CRC code is derived. Consequently, for the microprocessor, the CRC code can be generated at a high speed using the computation commands of the CRC code section. Corresponding techniques for error-checking of received data are also disclosed.

11 Claims, 5 Drawing Sheets

| DATA0 | F2 | 92 | 0F | 00 | 00 |
| --- | --- | --- | --- | --- | --- |
| DATA1 | 01 | 6B | AA | FF | 00 |
| DATA2 | 83 | 55 | 00 | 55 | 00 |
| DATA3 | – | – | 55 | 11 | 00 |
| CRC. G | 37 | 8C | 79 | B8 | 59 |
| CRC. C | C4 | C4 | C4 | C4 | C4 |

MICROPROCESSOR HAVING BUILT-IN CRC SECTION AND METHOD FOR PERFORMING CRC OPERATIONS USING THE SAME

CROSS-REFERENCE TO RELATED APPLICATION

This application is based on and claims priority under 35 U.S.C. § 119 from Japanese Patent Application No. Hei 6-156201, incorporated herein by reference.

BACKGROUND OF THE INVENTION

1. Field of the Invention

This invention concerns a microcomputer that can perform CRC (cyclic redundancy check) operations, which is used in the error-checking of transmission data and the like, and which can generate CRC codes for such CRC operations.

2. Description of Related Art

Conventional microprocessors generate and check CRC codes of transmission data using special purpose CRC code generating and checking hardware or using an existing arithmetic circuit inside an arithmetic logic unit (hereinafter "ALU") in conjunction with CRC code generating and checking software that has been formed by combining existing commands that correspond to each of the arithmetic circuits.

However, since a functional circuit block for generating and checking the CRC codes, separate from the functional block of the microprocessor, has to be added as in the former case where special purpose hardware for CRC code generation and checking is used, problems like complicated assembly work and increased costs due to the addition of the functional block for the CRC arise; for example, like the case when a car-mounted Local Area Network (hereinafter "LAN") is constructed by connecting various control devices through communication lines where each functional block has to be connected to each of the control devices.

On the other hand, for the latter case where CRC code generation and checking are based in software, there is no need to provide a special CRC functional block, thus, resulting in a simpler construction for the apparatus. For example, the assembly of the car-mounted LAN described above becomes simpler; however, since complicated computational processes have to be performed to generate and check CRC codes using software, it will take time to generate and check CRC codes and thus, problems such as drops in the transmission and reception speed arise.

In other words, in performing CRC code generation and checking, since processing of the transmission data has to be performed using a complicated polynomial, performing CRC code generation and checking using the software-based approach would take a lot of time and thus, this approach cannot be used in cases when quick responses of the controls are required as in the case of the automotive control system described above.

SUMMARY OF THE INVENTION

In consideration of these problems, a first object of the present invention is to perform high-speed CRC code generation and checking by the addition of a CRC code generation and checking section to the microprocessor. A further object of the invention is to provide a microprocessor that can be implemented with a simple structure and at a low cost.

In a first aspect, the present invention achieves these objects by providing a microprocessor which includes an arithmetic logic unit having a CRC code generating CRC arithmetic circuit including an exclusive OR circuit performing exclusive OR operations on data input thereto, the exclusive OR circuit being formed along one part of a path for inputting bit data or each bit data of the word or byte data to a shift circuit which shifts word or byte data including bit data and the inputs of which include one bit of data that corresponds to the path, bit data that is outputted to the outside by shifting the word or byte data, and bit data.

As described above, by providing at one part of a path for supplying each bit data of the word or byte data that has to be shifted and each word or byte data that shifts each bit data to a shift circuit of an arithmetic and logic unit (ALU) an exclusive OR circuit, which computes the exclusive OR of the one bit of data that corresponds to the path, the bit data from the word or byte data that the shift circuit outputs through its shift operation and the bit data, a CRC arithmetic circuit that generates and checks CRC codes is formed inside the ALU.

In short, by combining the shift circuit, which is usually installed inside the ALU and used for executing shift commands, one of the basic commands of the microprocessor, and the exclusive OR circuit, which is also usually installed inside the ALU, CRC arithmetic circuit for computing CRC codes is formed inside the ALU.

In this way, the CRC arithmetic circuit inside the ALU performs the computation functions for the CRC code computation using the CRC arithmetic circuit responsive to a CRC computation command, and high-speed CRC code generation and checking can be realized.

As described above, since the CRC arithmetic circuit is formed by combining the shift and the exclusive OR circuits that are, by convention, usually installed inside the ALU, the CRC arithmetic circuit can be easily implemented by changing only a part of the ALU of the conventional microprocessor without enlarging the ALU or increasing its manufacturing costs.

According to another aspect of the invention, a selector circuit is provided along the input path where the exclusive OR circuit has been set, selects between data outputted by the exclusive OR circuit and the one bit data that corresponds to the path according to the selection command, and provides the selected data to the shift circuit.

Preferably, all the data input paths to the shift circuit are connected to the exclusive OR and the selector circuits.

Thus, a selection circuit which inputs the data to the shift circuit by selecting between the data outputted by the exclusive OR circuit and the one bit data that corresponds to the input path according to the selection signal is set up at the input path for the data to the shift circuit in which the exclusive OR circuit is formed.

In this way, if the selection circuit selects the data that corresponds to the path using a selection command, the shift circuit will function as a regular shift circuit that shifts the data according to the shift command. On the other hand, if the selection circuit selects the data outputted by the exclusive OR circuit, the shift circuit will function as a CRC arithmetic circuit for computing CRC codes.

In short, according to this invention, the CRC arithmetic circuit can be made to function either as a CRC arithmetic circuit or as a regular shift circuit through software-based switching. Accordingly, there is no need to provide a separate shift circuit for the computation of CRC codes aside from the regular shift circuit inside the ALU; thus, the construction of the ALU can be made simpler.

Since exclusive OR and selector circuits are provided for each of the data input paths to the shift circuit, not only can the shift circuit be made to function as either a CRC arithmetic circuit or a regular shift circuit, but in addition, when the shift circuit is made to function as the CRC arithmetic circuit, the type of CRC code to be generated by the CRC generation circuit can be set arbitrarily by setting the values to be selected by each of the selection circuits arbitrarily.

In other words, when the CRC arithmetic circuit has an exclusive OR circuit at the data input path to the shift circuit, since the generating polynomial for CRC code generation is determined by the path provided with the exclusive OR circuit, then providing the exclusive OR and selection circuits for each of all the input paths and enabling the setting of each of the data to be selected by each of the selection circuits through the selection command, the CRC code generation polynomial equation can be set through software and thus, it is possible to arbitrarily set the type of CRC code obtained through the computation command.

Thus, in a preferred embodiment of the present invention, the generating polynomial used for CRC code generation and checking can be changed or altered in accordance with the microprocessor's application, the transmission format of the LAN connected to the microprocessor, and the like; thus, the scope of use of the microprocessor is widened.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PRESENTLY PREFERRED EXEMPLARY EMBODIMENT

A currently preferred embodiment of this invention is described below in conjunction with the appended drawings.

Figure 2:
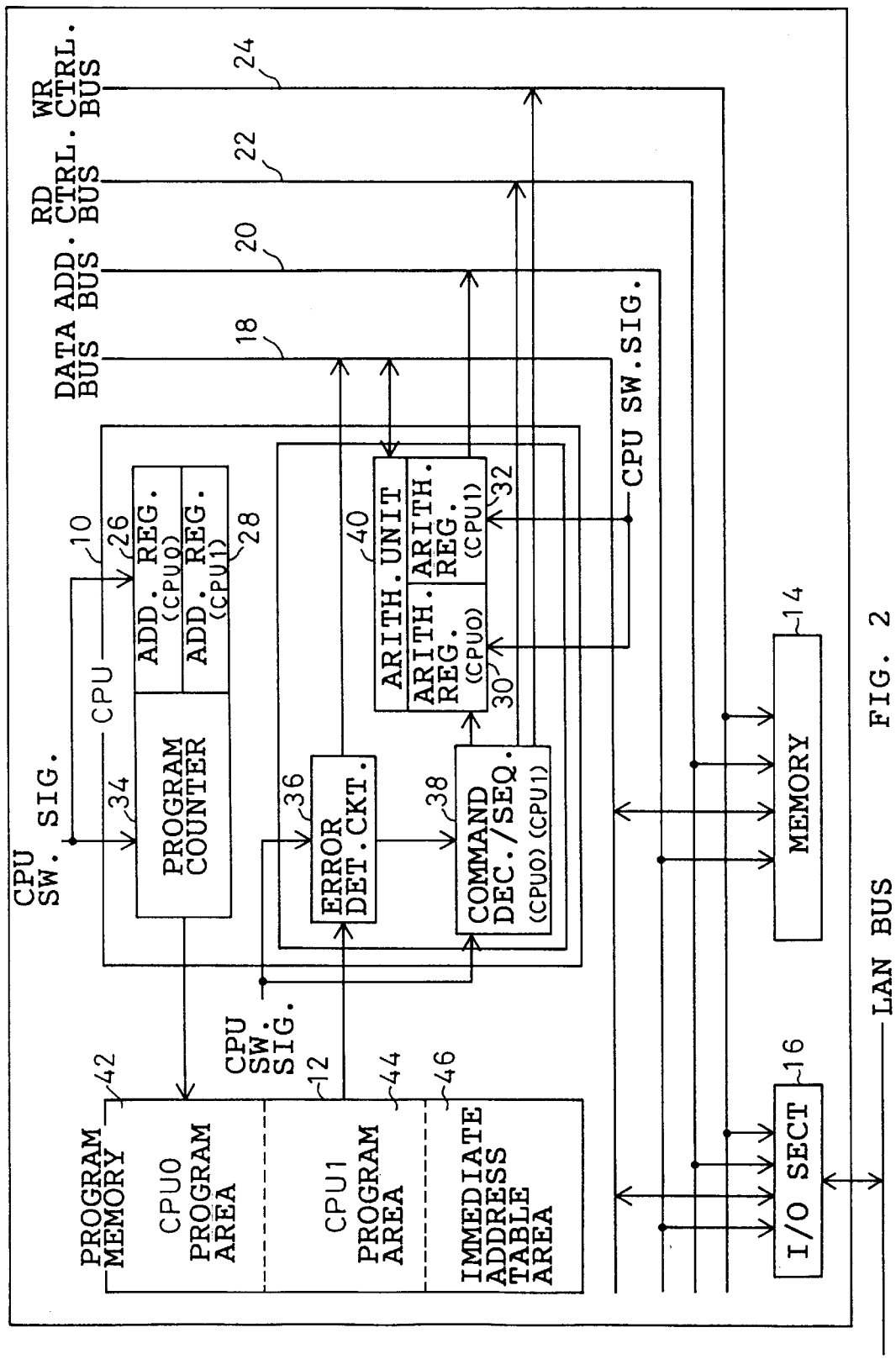
FIG. 2 is a block diagram that shows the construction of an entire microprocessor according to this embodiment.

FIG. 2 is a block diagram that shows a one-chip microprocessor according to an embodiment of the invention.

As shown in FIG. 2, the microprocessor of a preferred embodiment of this invention is an 8-bit microprocessor, which has a CPU 10, a program memory 12 composed of a ROM, a data memory 14 composed of a RAM, an input/output or I/O section 16, a timing generator (not shown) that generates a CPU switching signal to be explained later, an 8-bit data bus 18 that sends and receives data, an address bus 20 that sends and receives an address signal and control buses 22, 24 which send and receive read and write signals, respectively.

Moreover, to perform the time-divided parallel pipeline processing of two types of tasks (hereinafter termed an L task and an A task), the CPU is equipped with two address registers 26, 28 and two arithmetic registers 30, 32, and by alternately switching these address 26, 28 and arithmetic registers 30, 32 using the CPU switching signal generated by the timing generator, the CPU effectively functions as if it is two CPUs CPU0 and CPU1 while alternately switching between them.

Furthermore, in this embodiment, the address register 26 and the arithmetic register 30 are the registers for CPU0 (for the L task) while the other address register 28 and arithmetic register 32 are the registers for CPU1 (for the A task). The value of program counter 34 (i.e.,the address of the next command to be fetched) is updated in accordance with the switching of the address registers 26, 28, and the address signals of CPU0 (for the L task) and CPU1 (for the A task) are outputted alternately from the program counter 34 to the program memory 12.

Moreover, an error detection circuit 36, which identifies the type of task the command read from the program memory 12 belongs to and detects for errors in it, and a command decoder/sequencer 38, which decodes the command that has passed through the error detection circuit 36, are set up inside the CPU 10. Based on the contents of the command decoded by the command decoder/sequencer 38, computations are performed using the arithmetic registers 30, 32 of the arithmetic unit 40 that is acting as the arithmetic and logic unit and read or write signals are outputted to the control bus 22, 24.

On the other hand, a program region 42 for CPU0 (for the L task), a program region 44 for CPU1 (for the A task) and an immediate address table data region 46 are set up in the program memory 12. For this case, the L task stored in the program region 42 for CPU0 is made up of a fixed-loop program that prohibits branch instructions that can lead to runaway 10 programs. Accordingly, when running the programs of the L task, execution starts at the 0 address and proceeds with its sequential execution of the commands in the 1 address, 2 address, 3 address, . . . until it reaches a predetermined address where the program counter 34 overflows and returns to the 0 address, with the commands executed repeatedly in the same sequence as described above. It must be noted that for the L task, the commands are limited to one-word commands. The reason for this is that in a command system where the number of words for the command is not fixed (for example, a command system where there are one-word commands as well as two-word commands), if a two-word command is incorrectly read and is interpreted as a one-word command, since the next word is not necessarily a meaningful command, there will be no indication of what to execute next.

The program of the L task, which is suitable for performing sequentially-controlled processes, contains a routine for monitoring runaways of the other task, which is the A task, and a back-up sequence routine for implementing fail-safe functions in the system. Furthermore, this L task is also equipped with a timer function implemented using a fixed loop, e.g., producing a timer interruption when the counter's value reaches a predetermined value after running increment or decrement commands, and thus, fixed-time processing equivalent to a timer interruption is possible.

On the other hand, the A task allows branching instructions prohibited in the L task and is suitable for complex analytical and mathematical processing. In the same way as for the L task, the length of the commands for the A task are also limited to one word each. For the A and L tasks, the operation code and the operand (address) are both allocated within one word each.

Also, a task identification bit for identifying the type of task for each of the commands of CPU0 and CPU1 that are inside the program memory 12, is provided, for example, as the most significant bit ("MSB"). In this embodiment, the task identification bit is set as a parity bit where the L task is set to be of odd parity while the A task is set to be of even parity. For this case, not only task identification, but also command code checking is realized. In accordance with this goal, the error detection circuit 36 identifies the type of task the command read from the program memory 12 belongs to through the parity check, detects for errors in it and determines whether or not an unforeseen error has caused the execution of another task to be erroneously started.

That is, the error detection circuit 36, which is made up of a task identification circuit, an error flag circuit, a no-operation ("NOP") code circuit, pairs of transfer gates of the high-active and low active types and the like (not shown), identifies the type of the task to which the command read from the program memory 12 belongs to through parity checking (namely, if the parity is odd, then the task is identified as an L task; if the parity is even, then it is identified as an A task). The identification result is compared with the CPU switching signal to determine if an error has occurred or not and if an error has occurred, an error signal (e.g., a high-level signal) is outputted to the error flag circuit together with the resetting of the address register of the task where the error has occurred and at the same time, the error signal is also applied to the control terminal of the pair of transfer gates with the high-active type transfer gate turned on and the NOP code signal outputted from the NOP circuit to the command decoder/command sequencer 38 while turning off the low-active type transfer gate, thus preventing the passage of commands to the command decoder/command sequencer 38. As a result, for the case when an unforeseen error like noise,etc. which leads to branching to the address of another task by mistake and commencing the execution of the command therein has occurred, the NOP is performed immediately in only one command cycle and thus destruction of the memory and port data is prevented before it happens. Moreover, when no error has occurred, the error detection circuit 36 maintains the output of the task identification circuit at a low level, turns off the high-active type transfer gate and prevents the passage of the NOP code while turning on the low-active type transfer gate and allowing the passage of commands to the command decoder/command sequencer 38.

In this way, according to this embodiment, the CPU appears to function as if it is switching and moving two CPUS, thus making the execution of pipeline processing possible and moreover, with the length of all commands fixed to one word by assigning both the operation code and the operand to one word, problems which occur when the command is of a multi-word construction, (e.g., runaway programs, destruction of vital information in the data memory due to errors in recognizing the operation code and the operator, or problems caused by address errors and the like which made the program address branch to the address of the tabular immediate data region 46 with the commencement of the execution of the program with the immediate value 46 of the table treated as the operation code) can be prevented beforehand. The structure of the arithmetic logic unit 40, which is a primary part of this invention, is explained below.

Through the I/O section 16, the microprocessor can exchange data with other microprocessors and in carrying out this data exchange, the arithmetic logic unit 40 is equipped with the CRC arithmetic circuit which generates the CRC code to be attached to the data to be transmitted to check if the data is correct or not and which checks the CRC code attached to the data received.

Figures 1, 5A, 5B:
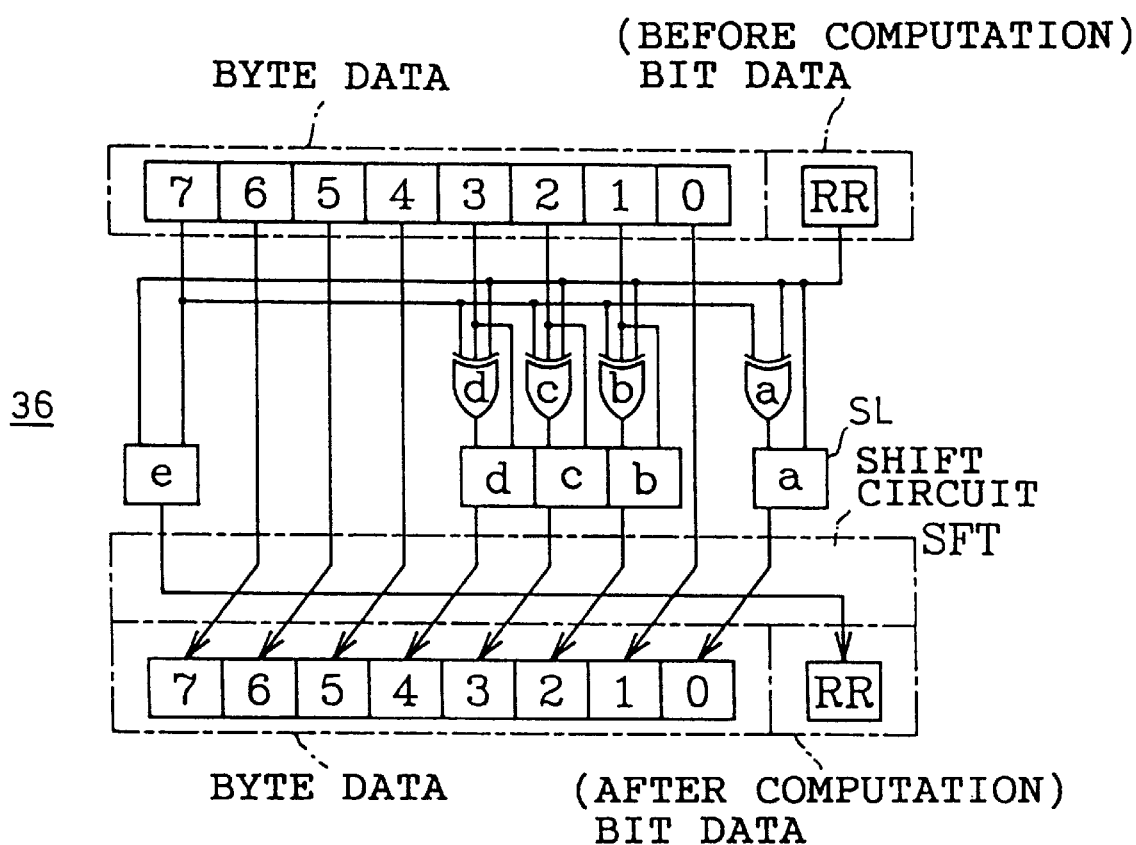
FIG. 1 shows the construction and operation of a CRC arithmetic circuit according to a preferred embodiment of the present invention.
FIGS. 5A and 5B show an example of a CRC code generated by following the flowchart of FIG. 4.

This CRC arithmetic circuit, as shown in FIG. 1, is formed by combining the shift circuit SFT, which shifts byte data, including bit data, according to a shift command and which has been conventionally installed in the arithmetic logic unit 40 to execute the commands of the microprocessor, the exclusive OR circuit EXOR for performing exclusive OR computations on the input data according to exclusive OR commands, and the selector SL, which selects one of two data inputs according to a selection command.

Figures 3, 7:
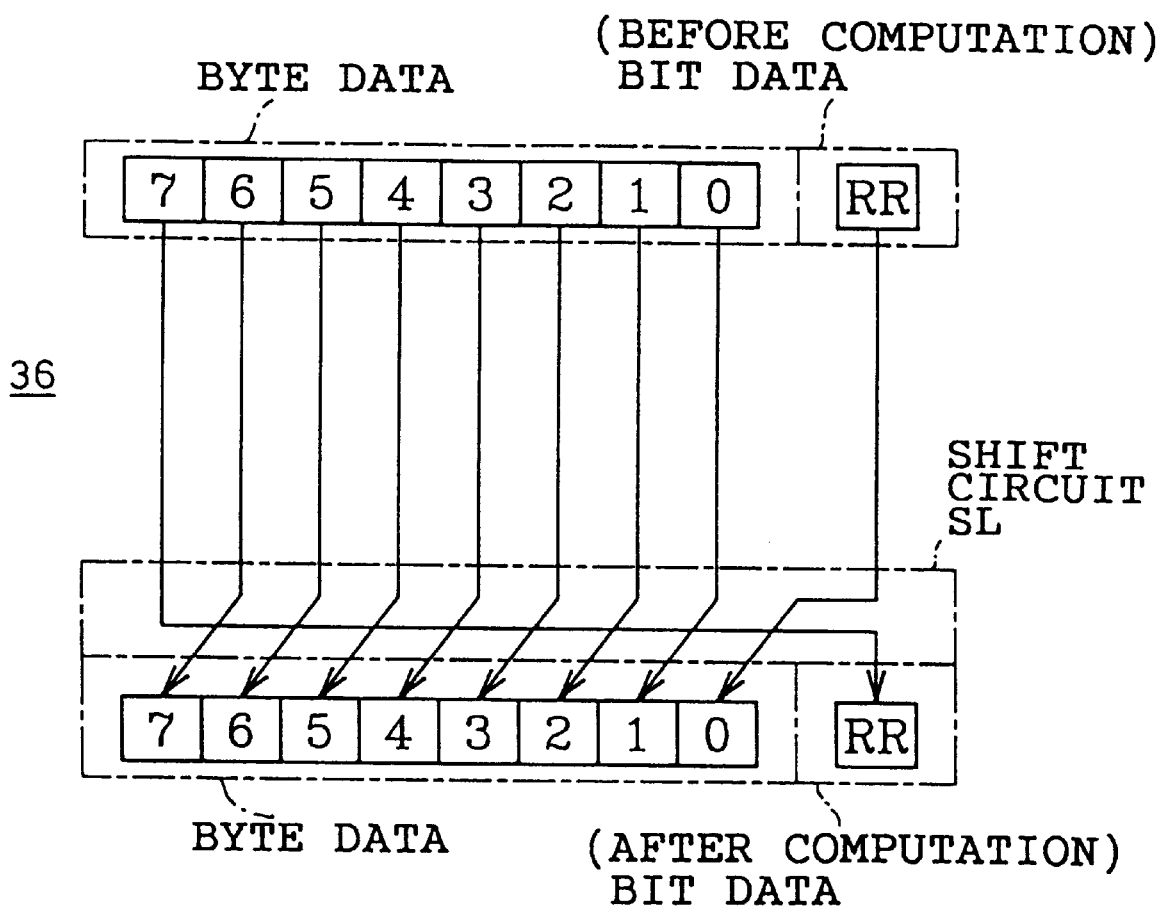
FIG. 3 shows the construction and operation of a conventional shift circuit.
FIG. 7 shows an example of a CRC code used for checking generated by following the flowchart of FIG. 6.

As shown in FIG. 3, while the shift circuit shifts the byte data [0]~[7] to the side of the uppermost bit [7] (or lowermost bit [0]) one bit at a time following the shift command, and sets the uppermost bit [7] (or lowermost bit [0]) displaced by the shifting as the bit data after computation [RR] by entering the bit data stored in the bit data storage region inside the arithmetic register [RR] to the lowermost bit [0] (or uppermost bit [7]) of the byte data stored in the byte data storage region of the arithmetic register, the CRC arithmetic circuit of this embodiment uses, as its shift circuit, the shift circuit (in short, the shift circuit shown in FIG.3) which shifts the data to the side of the uppermost bit.

The CRC arithmetic circuit is formed by placing along each data path to the shift circuit SFT (specifically, along each of those paths, which input the bit data [RR], the second data from the bottom of the byte data [1], the third data of the same [2] and the fourth data [3], exclusive OR circuits EXORa~EXORd that compute the exclusive OR of the data that corresponds to each path [RR], [1], [2] and [3] with the bit data [RR] and the data of the uppermost bit [7] displaced to the outside when the shift circuit SFT performs the shift operations, selectors SLa~SLd that select either the outputs of each of the exclusive OR circuits EXORa~EXORd or the data [RR], [1], [2] or [3] that corresponds to each of the corresponding paths for inputting data to the shift circuit SFT, and furthermore, the selector SLe, which chooses between the uppermost bit [7] displaced when the shift circuit SFT performs its calculations and the bit data [RR] and which inputs its choice to the shift circuit SFT.

For the CRC arithmetic circuit of this embodiment constructed in this way, if the shift command is entered, all of the selectors SLa~SLe are switched to the side where they select the input data presented to the right side (namely, the data [RR], [1], [2], [3] and [7] that correspond to each of the paths) of corresponding selectors of FIG. 1 and the shift circuit will perform the shift operation. As a result, the CRC arithmetic circuit will function as the regular shift circuit shown in FIG. 3 where the byte data [0]~[7] are shifted one bit each to the side of the uppermost bit using the bit data [RR].

On the other hand, for the CRC arithmetic circuit, if the CRC arithmetic command is entered, all of the selectors SLa~SLe are switched to the side where they select the input data presented to the left side (namely, the output data from the exclusive OR circuits EXORa~EXORd and the bit data [RR]) of the selectors of FIG. 1 and with the shift circuit SFT executing the shift operations, the byte data [0]~[7], after performing the arithmetic operation, are set through Eqs.

(1)~(8). It must be noted that Eqs. (1)~(8) indicate the contents of the operations on the data [0]~[7] and the bit data [RR] using the CRC arithmetic commands of the CRC arithmetic circuit and that the symbol ⊕ denotes the exclusive OR operation.

$$\text{Data }[0] \leftarrow \text{Data }[7] \oplus \text{Bit Data }[RR] \quad (1)$$

$$\text{Data }[1] \leftarrow \text{Data }[0] \quad (2)$$

$$\text{Data }[2] \leftarrow \text{Data }[7] \oplus \text{Bit Data }[RR] \oplus \text{Bit Data }[1] \quad (3)$$

$$\text{Data }[3] \leftarrow \text{Data }[7] \oplus \text{Bit Data }[RR] \oplus \text{Bit Data }[2] \quad (4)$$

$$\text{Data }[4] \leftarrow \text{Data }[7] \oplus \text{Bit Data }[RR] \oplus \text{Bit Data }[3] \quad (5)$$

$$\text{Data }[5] \leftarrow \text{Data }[4] \quad (6)$$

$$\text{Data }[6] \leftarrow \text{Data }[5] \quad (7)$$

$$\text{Data }[7] \leftarrow \text{Data }[6] \quad (8)$$

These data operations correspond to the CRC code generating polynomial $[X^8+X^4+X^3+X^2+1]$ and the byte data after the computation using this CRC arithmetic circuit [0]~[7] become the CRC generation data. In short, if the CRC arithmetic circuit is made to operate as in the above responsive to the CRC computation command, the CRC arithmetic circuit, in accordance with the bit position (in this embodiment, [1], [2], [3], [4]) of the byte data during the shift operation after adding [data [7] ⊕ bit data [RR]] through the use of the exclusive OR circuits EXORa~EXORb, becomes a circuit that realizes a generating polynomial and following this generating polynomial, CRC generation data can be made. For the generating polynomial $[X^8+X^4+X^3+X^2+1]$ realized by the CRC arithmetic circuit, the term $[X^8]$ expresses an eighth degree generating polynomial which does not overlap which the position of the exclusive OR circuit EXOR.

Next, using the CRC arithmetic circuit of this embodiment, the CRC code generation procedure for affixing CRC codes to the transmission data and the CRC checking procedure, which uses the CRC code affixed to the received data to determine whether or not there is an irregularity in the received data due to noise and the like during data transmission, are explained.

Figure 4:
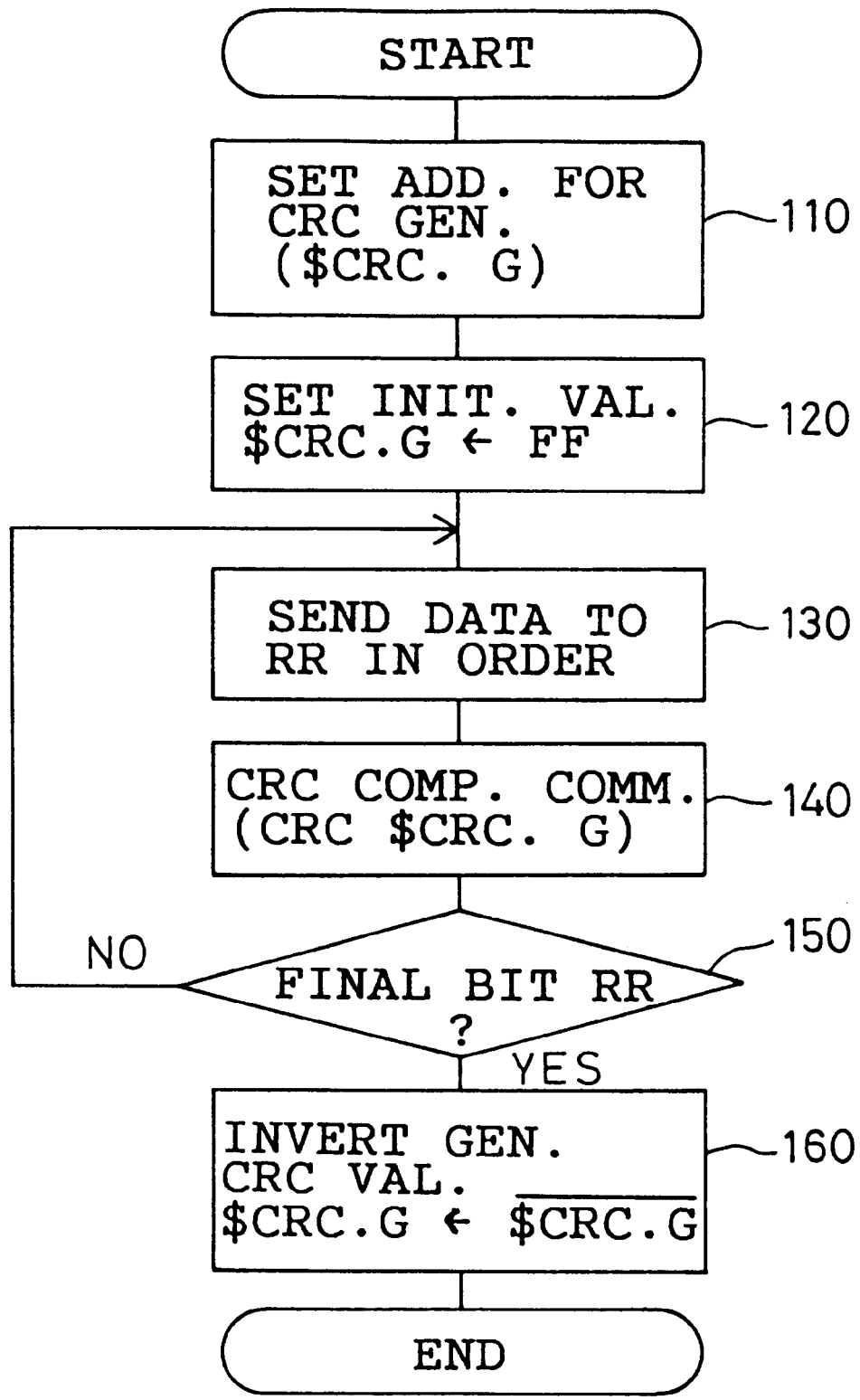
FIG. 4 shows a flowchart of the processing procedure when a CRC code is generated using the CRC computation circuit of this embodiment.

FIG. 4 is a flowchart that shows the steps for generating CRC code.

As shown in FIG. 4, during the generation of the CRC code, first at step 110, the address of the data memory 14 for storing the CRC code is set as, for example, [$CRC.G] and next, in step 120, the initial value of the storage region of the address [$CRC.G] is set as [FF]. [FF] is the hexadecimal expression while the equivalent binary expression would be [11111111].

Then, in step 130, a bit of data of the transmitted data is transferred starting with the uppermost bit to the storage region of the bit data [RR] of arithmetic registers 30 or 32. For example, immediately after commencing the CRC code generation, the data of the most significant bit is transferred to either arithmetic register 30 or 32 as the bit data [RR].

In this way, after transferring one bit of the transmission data to either arithmetic register 30 or 32 as the bit data [RR], then step 140 is executed next where the data inside [$CRC.G], which was set as the storage region in step 110 above for the CRC code, is set as the byte data and the CRC command for executing the arithmetic operation of the CRC arithmetic circuit, for example [CRC $CRC.G], is produced.

Then, in the following step 150, the data transferred as the bit data [RR] to either arithmetic register 30 or 32 in step 130 is examined to determine whether it is the lowermost data; in other words, it is checked to see if it is the last bit of the CRC code generation and if not, $CRC.G is set to the CRC code computed in step 140 and step 130 is performed again where a bit, which is one position lower than the previous data transferred to register 30 or 32 as the bit data [RR], is transferred to register 30 or 32 as the new bit data [RR] and then, at step 140, a CRC arithmetic command is generated.

As a result, for the CRC arithmetic circuit, with the value [FF] (hexadecimal expression) as the initial value (byte data), the CRC code is computed sequentially starting with the uppermost bit of the transmission data using the above generating polynomial.

On the other hand, in step 150, if the one bit data transmitted to register 30 or 32 as the bit data [RR] is determined to be the final bit during the CRC code generation, then step 160 comes next. In this step, each of the bits of the generated value of the CRC code derived through the CRC code computation operation is inverted and this inverted value is set as the CRC code to be affixed to the transmission data.

In this way, the generation of the CRC code is executed by the following procedure, in which, at first, [FF] is set as the initial value of the CRC code (in short, the byte data) and, as the bit data [RR], transmission data is sent sequentially one bit at a time starting from the uppermost bit of the transmission data with the CRC computation being performed successively by the CRC arithmetic circuit until the computation is completed for all the bits of data of the transmission data. When the computation is completed, the generated value of the CRC code is inverted. For this reason, the CRC can be computed for any number of bytes of transmission data using the generating polynomial.

For example, FIG. 5 shows the transmission data and the CRC code generated using the computation circuit of this embodiment and from it, it can be seen that even if the byte data has three bytes of data from byte data DATA0 to byte data DATA2 or even four bytes of data from byte data DATA0 to byte data DATA3, the CRC code can be generated by performing the CRC computation for each of the byte data starting from the uppermost bit.

FIG. 5A shows the data structure of the transmission data during data transmission. The transmission data from byte data DATA0 to byte DATAn affixed with the CRC code (CRC.G), which is generated through the CRC code generation process described above, is transmitted to the other units as the transmission data. In addition, FIG. 5B shows the computation result of the CRC code, for example, if the transmission data is made up of three bytes of data DATA0~DATA3, which in hexadecimal are [F2], [01] and [83], then the hexadecimal expression [37] is set as the CRC code.

Figure 6:
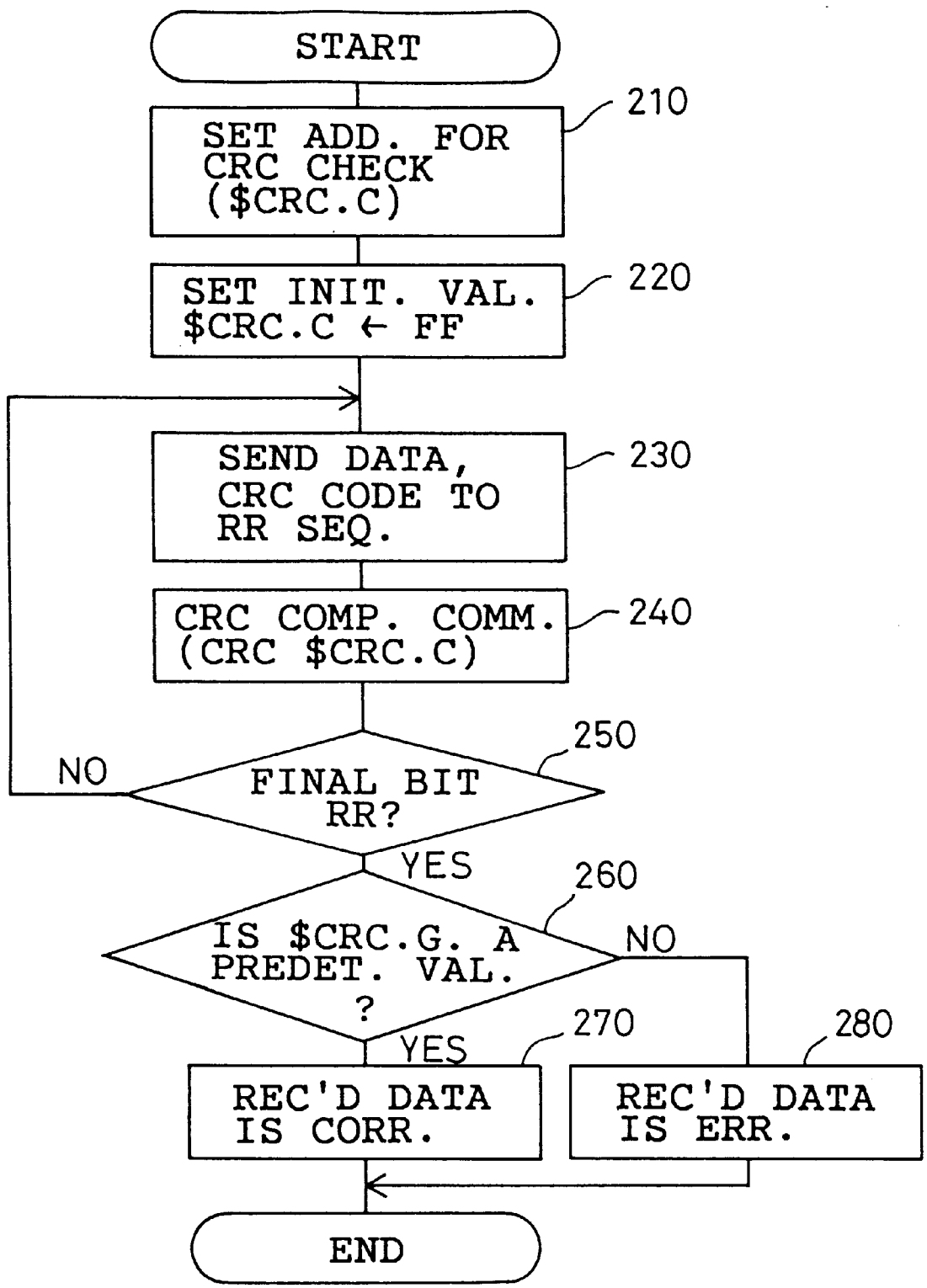
FIG. 6 shows a flowchart of the processing procedure when a CRC code is checked using the CRC computation circuit of this embodiment.

Next, FIG. 6 is a flowchart which shows the CRC checking procedure for performing CRC checks on the received data.

As shown in FIG. 4, when performing CRC checks, first, in step 210, the address of the data memory 14 for storing the CRC code for CRC checking (referred to below as simply the check code) is set as, for example, [$CRC.C] and in the following step 220, an initial value [FF] is set at the [$CRC.C] address.

Then, in the following step 230, a bit of data of the received data, starting with its uppermost bit, is transferred to the storage region of the bit data [RR] of the register 30 or 32 and in the next step, step 240, with the data stored inside [$CRC.C], which has been set in the above step 210 as the storage region of the check code of the data memory 14, set as the byte data, the CRC computation command for making the CRC arithmetic circuit execute the arithmetic operation of the CRC code, e.g. [CRC, $CRC.C], is generated.

Then, in step 250, the data sent in step 230, as the bit data [RR] of register 30 or 32, is checked to see if it is the final bit of the received data; in other words, the data is examined to see if it is the lowermost bit of the CRC code attached to the received data and if it is not, $CRC.G is set to the value of the calculated CRC code and control is again transferred to step 230 and one bit of data, which is one position lower than the bit of data sent previously to either arithmetic register 30 or 32 as the bit data [RR], is sent to either arithmetic register 30 or 32 as the new bit data [RR] and in the next step, step 240, the CRC computation command is generated.

As a result, in the CRC arithmetic circuit, with the value [FF] (hexadecimal expression) as the initial value (byte data), the check code is computed using the generating polynomial above starting sequentially from the uppermost bit of the received data.

On the other hand, in step 250, if the one bit of data sent to either arithmetic register 30 or 32 as the bit data [RR] is determined to be the final bit of the received data, then control is transferred to step 260. Then, in step 260, the check code, which was derived through the above arithmetic operations, is checked to see if it is equal to a predetermined value (which is the hexadecimal expression [C4] in this embodiment) and if the check code equals the predetermined amount [C4], then, in step 270, the received data is determined to be normal; if the check code does not equal the predetermined amount [C4], then, in step 280, the received data is determined to be abnormal. After all of these operations, the CRC checking process is terminated.

In short, as shown in FIGS. 5A and 5B, when transmission data affixed with a CRC code is received, if the data transmission is performed normally, the check code (CRC.C) generated as in the above-described process equals the predetermined amount as shown in FIG. 7, and thus, for the CRC checking process, the correctness of the received data is determined by checking to see if the check code generated in the above manner from the received data is equal or not to the predetermined amount [C4].

It must be noted that the checkcode is [C4] because the generating polynomial of the CRC code has been set as $[X^8+X^4+X^3+X^2+1]$ and thus, if a different generating polynomial is used, then, a checkcode that corresponds to that polynomial must be set as the predetermined value.

As explained in the above, for the microprocessor of this embodiment, the CRC arithmetic circuit that follows CRC computation commands in performing CRC code generation and checking is installed inside the computing element 40, which acts as the arithmetic and logic unit (ALU).

Accordingly, in a microprocessor according to this invention, when performing the generation and checking of the CRC code, there is no need to provide a separate special-purpose block for the CRC and thus, CRC code generation and checking can be done with one single-chip microprocessor.

In addition, in a microprocessor according to this invention, because the computation using the generating polynomial for generating and checking CRC code, unlike in the conventional apparatus where it is performed through the software-based method of combining basic commands, can be performed simply by operating the CRC arithmetic circuit installed inside the arithmetic logic unit 40 using CRC computation commands, not only can the CRC code generation and checking be performed with only a single-chip microprocessor, but also the computation for CRC code generation and checking can be performed at high-speed.

Therefore, a microprocessor according to the present invention can be used in cases when high-speed data transmission is needed, for example, in a control device that constitutes one node of the car-mounted LAN.

Furthermore, the CRC arithmetic circuit of this embodiment, through the CRC computation commands, performs not only the operations for CRC code generation and checking, but also, if a shift command is inputted and the data path to the shift circuit SFT is switched through selectors SLa~SLe to a direction different than that during CRC computation, it functions, through the shift circuit SFT, as a regular shift circuit that shifts byte data, including bit data. For this reason, there is no need to provide a regular shift circuit separate from the CRC arithmetic circuit inside the arithmetic logic unit 40.

Moreover, because the CRC arithmetic circuit is realized by combining the shift, exclusive OR and selector circuits, all of which correspond to basic commands provided in the arithmetic logic unit, then it can be formed by only altering a part of the ALU in conventional microprocessors and thus the CRC arithmetic circuit can be implemented simply without enlarging the ALU or increasing the costs of fabrication.

While the CRC arithmetic circuit according to the present invention has been constructed so that it performs the CRC code calculation using the generating polynomial $[X^8+X^4+X^3+X^2+1]$, since this generating polynomial has been determined on the basis of the installation location of the exclusive OR circuit along the input path of the shift circuit SFT and since this changes when the location is changed, then, the generating polynomial used in CRC code generation and checking should be set according to the location and number of exclusive OR circuits.

In addition, if, for example, exclusive OR circuits EXOR and selectors SL are installed at all the input data paths to the shift circuit and if the selector SL, which selects the output of the exclusive OR circuit EXOR, is set using software for performing the CRC computations using the CRC arithmetic circuit, then, the generating polynomial used in CRC code computation can be set through software.

Likewise, for this case of installing exclusive OR circuits EXOR and selectors SL for all the data input paths to the selector circuit SL, for example, by setting multiple CRC computation commands beforehand together with storing the selectors SL that would select the output of the exclusive OR circuit inside the registers and the like, the selector SL corresponding to the command code can also be made to follow the data inside the register so that it switches automatically when a CRC computation command is generated.

Although the present invention has been fully described in connection with a preferred embodiment thereof, various changes and modifications will be apparent to those skilled in the art. Such changes and modifications are to be understood as being included within the scope of the present invention as defined by the appended claims.

What is claimed is:

1. A computational circuit in a microprocessor, said circuit comprising:
   a plurality of input lines;
   a function generating section, connected to said input lines, for generating a value based on exclusive-OR operations of bits of input data on the input lines, the value being output at a first plurality of outputs;
   a selection section connected to said plurality of input lines and to said first plurality of outputs for selectively providing signals from said input lines and signals from said first plurality of outputs at a second plurality of outputs responsive to a selection command;

a shift circuit, connected to said second plurality of outputs, for selectively shifting bits of said second plurality of outputs responsive to a control signal and providing the same at a third plurality of outputs; and a plurality of output lines connected to said third plurality of outputs; wherein a CRC code is generated by at least said function generating section, said selection section, and said shift circuit using data input via said plurality of input lines, and the CRC code is output onto said plurality of output lines with the output data when data including a CRC code of the same type as the generated CRC code is input via said plurality of input lines, and wherein CRC checking of the input data is performed by at least said function generating section, said selection section, and said shift circuit.

2. The computational circuit of claim 1, wherein said function generating section and said shift circuit are contained within an ALU of said microprocessor for operation of said microprocessor.

3. A computational circuit in a microprocessor, said circuit comprising:

a plurality of input lines;

an exclusive-OR gate having at least one input connected to a corresponding input line;

a first selector circuit having a first input connected to an output of said exclusive-OR gate and a second input connected to a corresponding one of said plurality of input lines, said first selector circuit providing one of said first and second inputs at an output thereof responsive to a selection command;

a first circuit, connected to said first selector circuit output, for shifting said first selector circuit output responsive to a control signal, and a plurality of output lines including an output line connected to a corresponding output of said first selector circuit; wherein a CRC code is generated by at least said exclusive-OR gate, said first selector circuit, and said first shifting circuit using data input via said plurality of input lines, and the CRC code being output onto said plurality of output lines when data including a CRC code of the same type as the generated CRC code is input via said plurality of input lines, and when the data including the same CRC code as the generated CRC code is input via said plurality of input lines, at least said exclusive-OR gate, said first selector circuit and said shift circuit perform CRC checking of the input data.

4. The circuit of claim 3, further comprising:

a second selector circuit having first and second inputs connected to corresponding ones of said plurality of input lines and an output connected to a corresponding one of said output lines.

5. The circuit of claim 3, wherein at least one of said plurality of input lines is connected to a corresponding one of said plurality of output lines.

6. The circuit of claim 3, further comprising:

a second selector circuit having first and second inputs connected to corresponding ones of said plurality of input lines and an output connected to a corresponding one of said output lines;

wherein at least one of said plurality of input lines is connected to a corresponding one of said plurality of output lines.

7. The circuit of claim 6, wherein said first and second selector circuits and said at least one input line connected to a corresponding one of said output lines are arranged according to a CRC code generating polynomial.

8. The circuit of claim 3, wherein said circuit selectively acts as a shift register and as a CRC code generating circuit responsive to said selection command.

9. The circuit of claim 3, wherein:

said plurality of input lines includes a plurality of input lines corresponding to byte data and an input line corresponding to bit data, and said plurality of output lines includes a plurality of output lines corresponding to byte data and an output line corresponding to bit data.

10. The circuit of claim 3, wherein said circuit includes an exclusive OR gate having at least two inputs connected to different ones of said input lines.

11. The computational circuit of claim 3, wherein said exclusive-OR gate and said first circuit are contained within a ALU of said microprocessor for operation of said microprocessor.

* * * * *